United States Patent [19]

Ziemek

[11] 3,866,315

[45] Feb. 18, 1975

[54] METHOD OF MAKING A STABILIZED SUPER-CONDUCTOR

[75] Inventor: Gerhard Ziemek, Hannover, Germany

[73] Assignee: Kabel-und Metallwerke Gutehoffnungshutte AG, Hannover, Germany

[22] Filed: Feb. 21, 1974

[21] Appl. No.: 444,568

[30] Foreign Application Priority Data

Feb. 22, 1973 Germany .......................... 2308747

[52] U.S. Cl. .................... 29/599, 29/477, 29/527.4, 29/DIG. 12, 204/29, 204/38 B

[51] Int. Cl. ........................................ H01v 11/14

[58] Field of Search ........ 219/61, 137; 29/477, 599, 29/527.4, DIG. 12, 527.2; 174/126 CP, DIG. 6; 204/29, 38 B

[56] References Cited

UNITED STATES PATENTS

| | | | |
|---|---|---|---|
| 3,406,105 | 10/1968 | Letendre | 204/29 X |
| 3,454,472 | 7/1969 | Giuffrida | 204/29 |
| 3,775,840 | 12/1973 | Diepers et al. | 29/599 |
| 3,781,982 | 1/1974 | Ziemek | 29/599 |

*Primary Examiner*—C. W. Lanham
*Assistant Examiner*—D. C. Reiley, III
*Attorney, Agent, or Firm*—Ralf H. Siegemund

[57] ABSTRACT

Copper particles are brushed from a copper strip edge, onto and into a surface of a niobium tape to obtain a thin layer of copper particles in preparation for a subsequent, electrolytic copper plating process. The resulting assembly is subsequently stretch rolled for enhancing the bond in the copper-niobium laminated assembly. The strip assembly may subsequently be shaped into a corrugated tube to be included in a cryogenic cable.

7 Claims, 5 Drawing Figures

METHOD OF MAKING A STABILIZED SUPER-CONDUCTOR

BACKGROUND OF THE INVENTION

The present invention relates to a method and process of making a stabilized super-conductor and more particularly the invention relates to improvements in a method according to which a tape, strip or ribbon of niobium or a niobium alloy is rendered electrically conductive on the surface of at least one of its two sides, and wherein subsequently copper is electrolytically deposited on that side.

The continuing advance in the technology related to superconductors has lead increasingly to so-called stabilized conductors, which are conductors having a relatively large cross-section of (regularly) electrically conductive material and a small cross-section that is superconductive at low temperatures. Niobium is usually used for superconduction, and copper is used for regular conduction of electric current. The copper layer changes the magnetic flux and critical magnetic field and also serves as normal conductor operating in parallel with the superconductive layer. The copper layer becomes fully operative if for some reason the niobium leaves the superconductive state. When not superconductive, niobium is a rather poor conductor for electric current.

Such a stabilized assembly requires that copper and niobium strata are firmly, lastingly and permanently interconnected. Some methods are known for providing a copper layer on a niobium substrate. For example, tin is provided onto the niobium surface and diffused into the niobium lattice. The thus treated surface is pickled by means of a liquid containing hydrofluoric acid and nitric acid. Finally, the niobium is electrolytically plated with copper.

It can be seen that the copper plating process is rather complicated. Moreover upon heating such a superconductor assembly a layer of $Nb_3Sn$ is formed between the copper and niobium layers which is rather brittle. Upon flexing or bending such an assembly the layers may well delaminate so that generally firm adhesion between copper and niobium layers cannot be relied upon. (See e.g. German printed Patent application No. 1,521,010)

SUMMARY OF THE INVENTION

It is an object of the present invention to provide for a method of providing a copper layer onto a niobium substrate which is durable and resists mechanical wear.

It is another object of the present invention to improve a method according to which a tape, ribbon, strip or sheet made of niobium or a niobium alloy is copper plated on at least one of its sides.

In accordance with the preferred embodiment of the invention it is suggested to brush a metal, e.g. copper or a copper alloy in powderous form into the niobium prior to copper plating it. This way, a very thin copper layer is provided on the niobium substrate which is sufficient to permit subsequently electroplating of copper onto the niobium.

It should be avoided that oxides are brushed into the niobium, so that it is advisable to conduct the brushing step in a reducing atmosphere, in a protective gas atmosphere or in vacuum.

In furtherance of the invention, the copper particles are produced on location in that a copper sheet or strip is fed towards the brushing zone and the brush breaks off particles of the front edge of the copper sheet or strip and brushes them onto and into the niobium sheet. Copper is subsequently electrolytically deposited on the particle layer. The resulting compound or laminated sheet or strip structure has a relatively large thickness and cross-section of copper as disposed on a rather thin niobium substrate. This assembly is preferably reduced in thickness by a deforming process such as rolling or stretching and for a degree of deformation of at least 50%. If one uses less than 50% deformation, the assembly should be heated. In either case, the bond between the lamination is greatly improved by such plastic deformation.

A copper-niobium strip made in this manner is preferably longitudinally folded into a split tube so that the longitudinal edges of the strip abut. The edges are arc welded to obtain a tubular superconductor assembly. The resulting tube is preferably corrugated and included in an assembly of concentric corrugated tubes for use in a cryogenic cable.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Proceeding now to the detailed description of the drawings, FIG. 1 illustrates a spool 1 for delivery of niobium tape or strip 2 having thickness in the range from about 0.1 to 1 mm. The tape may also be comprised of a niobium alloy of the variety known for its use as superconductor. Tape 2 is withdrawn from the spool on a continuous basis, and runs across a flat support 3. The tape is subsequently reeled onto a spool 4, after having undergone several process steps to be explained next.

Figure 1:
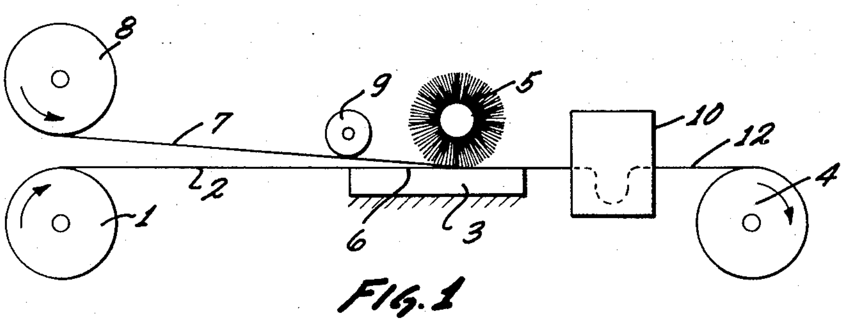
FIG. 1 illustrates schematically a side view of equipment for brushing copper particles into a niobium tape.

A counterclockwise rotating brush 5 is disposed above support 3. The brush is preferably constructed to have a large plurality of fine steel wires extending radially from a hub portion. The drive for brush 5 is not shown and is conventional.

A copper tape, strip or sheet 7 is continuously paid from a spool 8, but at considerably lower speed than tape 2. A roller 9 runs the tape 7 into close vicinity of tape 2, even in contact therewith but not for frictional engagement to such an extent that the tape 7 would be carried along by tape 2.

The copper tape 7 is fed so that its front edge 6 is and remains in engagement with rotating brush 5. Thus, copper particles are continuously torn from edge 6 of the copper tape and brushed into the passing niobium tape. The brush 5 provides particularly for continuous brushing in of copper particles into the niobium tape.

The copper tape 7 is actually withdrawn by means of withdrawal pulley which are not shown and in a manner which is conventional in the art of tape and strip advance. The advance is carried out at the rate brush 5 breaks off copper particles. Please note, that tape 7 could be run in opposite direction and fed to the other (right) side of brush 5. Of course, the brush would have to rotate clockwise in this case.

As a consequence of the process as described, a very thin copper layer is mechanically placed onto the niobium tape and is actually worked into the surface thereof. The dimensions of this layer depend on the speed of the tape 2 and the working speed of the brush as well as the pressure exerted onto tape 2. The resulting layer will be quite thin in comparasion with the thickness of tape 2.

The niobium tape 2 is thus provided with a layer of copper particles worked into the niobium surface strata and may now be passed through a copper plating station 10 which may include one or several electrolytic baths. The niobium tape 2 is, therefor, copper plated, and the copper layer so produced may be quite thick, quite thicker actually than the niobium tape.

Figure 2:
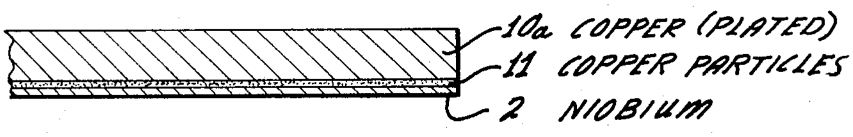
FIG. 2 illustrates a cross-section through a superconductor assembly as made in accordance with the method practiced with the equipment of FIG. 1.

FIG. 2 illustrates somewhat schematically the completed assembly. The niobium ribbon 2 carries the brushed on copper particle layer 11 whose thickness is greatly exaggerated in the drawing. A copper layer 10*a* has been plated onto that combined substrate 2–11, whereby the brushed-in copper particles of layer 11 provide for a firm bond as between the copper plating and the niobium substrate. The completed product may then be reeled onto spool 4 as indicated in FIG. 1.

Figure 3:
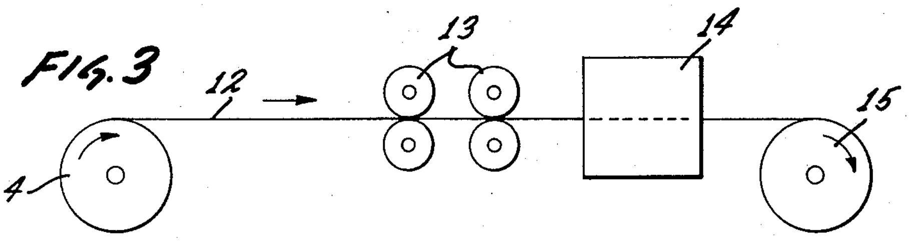
FIG. 3 illustrates equipment for stretch rolling the strip made with the equipment shown in FIG. 1.

FIG. 3 illustrates a further step of the process for refining the method as described thus far. The tape or strip 12 as produced should be uniformly thick. For this, strip 12 is reeled from the spool 4 and rolled down by means of a stretch rolling mill 13, reducing the thickness of strip 12 to a uniform value. As a consequence, the metallic bond between copper layer 10*a* and niobium tape is improved. Particularly if the rolling is preceded by a slight heating of the strip 12 and/or if the degree of deformation by the rolling process is more than 50%.

Subsequent to rolling the laminated assembly 12 should pass through an annealing furnace for process annealing the copper-niobium strip 12 at a temperature of about 600° C, so as to sphereodize the strip which became hard during the rolling. The annealed strip is wound again on a spool 15.

Figure 4:
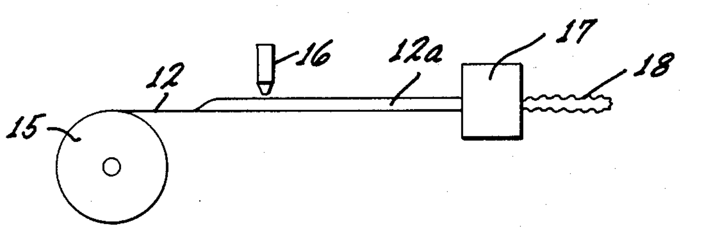
FIG. 4 illustrates schematically the forming of a tubular superconductor assembly using the strip as made in accordance with FIG. 1, possibly also FIG. 2.

The inventive method permits production of a stabilized superconductor assembly of, basically, endless configuration, depending on the length of the available niobium strip. The strip 12 is for example unreeled as shown in FIG. 4 and folded about a longitudinal axis to obtain a split tube 12*a*. The longitudinally abutting strip edges are then welded for example by arc welding, 16, in a protective atmosphere, so as to produce a superconductive tube. The superconductive niobium layer should be on the inside of the tube.

It should be noted, that a narrow portion of the niobium tape along both edges should remain free from copper plating so that copper will not impede the welding process of the niobium tape.

It was found advisable to pass the welded tube 12*a* through a corrugating station 17 to impart helical or annular corrugation upon the tube. The resulting tubular, corrugated superconductor assembly 18 is quite flexible and reelable and can be made at basically indefinite length, simply depending on the length of the strip. The conductor can be reeled on conventional cable drums.

It should be noted, that the process of making a superconductive tube was shown in three sections. (FIGS. 1, 3 and 4). In reality, one can combine two or three of these process steps into one continuous process without requiring inbetween reeling; this is simply a matter of available space for setting up the required long production line.

Figure 5:
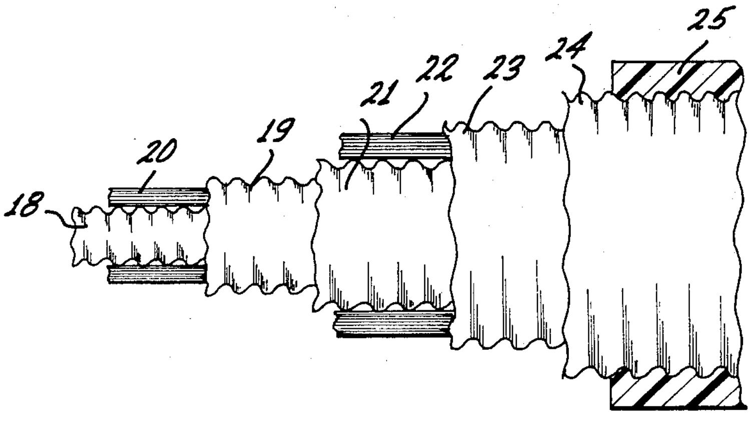
FIG. 5 shows a view into a concentric, multi tube assembly for a cryogenic cable wherein one tube after the other is exposed for purposes of illustration, the inner tube having been made in accordance with FIG. 4.

FIG. 5 illustrates a cryogenic cable of which the superconductor assembly, made in accordance with the invention, is the principle component. The cable includes a corrugated tube 18 made in accordance with the invention, with niobium on the inside for direct contact with a cryogenic liquid (e.g. liquid helium).

A tube 19 is concentrically disposed to tube 18, leaving a ring space in between which is filled with so-called super insulation 20. The insulation 20 is, for example, comprised of many layers of paper, and liquid helium flows also through that space between tubes 18 and 19. Tube 19 is likewise corrugated.

Tube 19 is received in another corrugated tube 21, holding tube 19 by means of isolated spacers (not shown), while the annular space between tubes 19 and 21 is evacuated. Another corrugated tube 23 receives concentrically tube 21, and super insulation 22 is disposed in the resulting ring space; liquid nitrogen flows also through that space.

Tube 23 is concentrically received by a corrugated tube 24 and held therein by isolated spacers. The annular space between these tubes is again evacuated. Reference numeral 25 refers to an outer jacket made of plastic and providing for additional thermal insulation as well as protection.

The cable can be made in great lengths, on a continuous basis by folding one strip after the other about the respective tube (tubes) as made thus far in continuous process; welding the adjoining edges, and corrugating the tube before folding the next strip etc.

In spite of the fact that the cable assembly illustrated in FIG. 5, is comprised of five concentric tubes, it is still flexible in its entirety due to corrugation in every tube. Moreover, the corrugation provides for adequate length compensations in the case of thermal expansion or contraction, particularly when low temperature liquid is passed through the installed cable. Compensation elements are not needed.

The cable can be reeled on drums and can be laid just as is conventional for cables.

The invention is not limited to the embodiments described above but all changes and modifications thereof not constituting departures from the spirit and scope of the invention are intended to be included.

I claim:

1. In a method of making a stabilized superconductor assembly which includes electrolytically depositing copper on a surface of a substrate containing niobium, the improvement comprising: brushing finely divided copper particles into the substrate surface, causing the copper particles to become worked into the niobium substrate to obtain a very thin copper particle layer in the substrate surface, and subsequently electrolytically depositing copper upon the copper particle-covered surface.

2. In a method as in claim 1, wherein a copper strip is fed to the substrate, the strip having a front edge, copper particles being broken off the edge by brushing, for brushing them into the substrate.

3. In a method as in claim 1, and including the step of deforming the substrate with electrolytically deposited copper for reducing thickness of the assembly to obtain a firmer bond between deposited copper, copper particles and substrate.

4. In a method as in claim 1, wherein the substrate is a continuously paid out niobium or niobium alloy tape.

5. In a method as in claim 4, wherein a copper strip is fed to the tape, the strip having a front edge, copper particles being broken off the edge by brushing for brushing them into the tape.

6. In a method as in claim 1, wherein the tape with copper particle layer and electrodeposited copper is continuously longitudinally folded into a split tube and welded along adjoining longitudinal edges.

7. In a method as in claim 6, including the step of corrugating the welded tube.

* * * * *